United States Patent
Tanaka

(10) Patent No.: US 11,437,956 B2
(45) Date of Patent: Sep. 6, 2022

(54) ELECTROMAGNETIC WAVE GENERATION DEVICE AND ELECTROMAGNETIC WAVE GENERATION SYSTEM

(71) Applicant: PIONEER CORPORATION, Tokyo (JP)

(72) Inventor: Hiroyuki Tanaka, Kawagoe (JP)

(73) Assignee: PIONEER CORPORATION, Tokyo (JP)

(*) Notice: Subject to any disclaimer, the term of this patent is extended or adjusted under 35 U.S.C. 154(b) by 0 days.

(21) Appl. No.: 17/290,679

(22) PCT Filed: Oct. 29, 2019

(86) PCT No.: PCT/JP2019/042275
§ 371 (c)(1),
(2) Date: Apr. 30, 2021

(87) PCT Pub. No.: WO2020/090782
PCT Pub. Date: May 7, 2020

(65) Prior Publication Data
US 2022/0006425 A1    Jan. 6, 2022

(30) Foreign Application Priority Data
Oct. 30, 2018   (JP) .............................. JP2018-203595

(51) Int. Cl.
*H03B 7/08*      (2006.01)
*H01L 29/06*     (2006.01)
(Continued)

(52) U.S. Cl.
CPC .............. *H03B 7/08* (2013.01); *H01L 29/06* (2013.01); *H01Q 5/00* (2013.01); *H01Q 5/30* (2015.01);
(Continued)

(58) Field of Classification Search
CPC .............. H03B 7/08; H03B 2200/0076; H03B 2200/008; H03B 2200/0084; H01L 29/06;
(Continued)

(56) References Cited

U.S. PATENT DOCUMENTS

| 2014/0061469 | A1* | 3/2014 | Hwang | ............... H01L 27/1464 250/338.4 |
| 2014/0172374 | A1  | 6/2014 | Brady | |
| 2015/0051496 | A1* | 2/2015 | Ouchi | .................. A61B 5/0062 600/473 |

FOREIGN PATENT DOCUMENTS

| JP | 2008500541 A | 1/2008 |
| JP | 2010048721 A | 3/2010 |

(Continued)

OTHER PUBLICATIONS

International Search Report from International Application No. PCT/JP2019/042275, dated Dec. 3, 2019, 2 pages.

(Continued)

*Primary Examiner* — Arnold M Kinkead
(74) *Attorney, Agent, or Firm* — Procopio, Cory, Hargreaves & Savitch LLP

(57) ABSTRACT

In an electromagnetic wave generation device including a plurality of electromagnetic wave generation elements, an instantaneous maximum power consumption during an electromagnetic wave generation operation is reduced. Specifically, the electromagnetic wave generation device includes a plurality of electromagnetic wave generation elements that are divided into a plurality of groups, and a control unit that causes the plurality of electromagnetic wave generation elements to oscillate while shifting a timing in units of group. For example, the control unit causes the plurality of electromagnetic wave generation elements to oscillate such that when the number of the plurality of groups is n, an oscillation start timing of the group that performs mth (Continued)

oscillation (m is a natural number equal to or larger than 2 and equal to or smaller than n) is the same timing as or after an oscillation end timing of the group that performs (m−1)th oscillation.

12 Claims, 13 Drawing Sheets

(51) Int. Cl.
    *H01Q 5/00*          (2015.01)
    *H01Q 23/00*        (2006.01)
    *H01Q 5/30*         (2015.01)
    *H01Q 5/307*       (2015.01)

(52) U.S. Cl.
    CPC ............. *H01Q 5/307* (2015.01); *H01Q 23/00* (2013.01); *H03B 2200/008* (2013.01); *H03B 2200/0076* (2013.01); *H03B 2200/0084* (2013.01)

(58) Field of Classification Search
    CPC ........................ H01Q 5/00; H01Q 5/30; H01Q 5/307; H01Q 23/00
    USPC ............ 343/700 MS; 250/349, 269.1, 338.4; 331/115, 132, 107 T; 257/21
    See application file for complete search history.

(56) References Cited

FOREIGN PATENT DOCUMENTS

| | | |
|---|---|---|
| JP | 2013190350 A | 9/2013 |
| JP | 2016080452 A | 5/2016 |
| JP | 2016080686 A | 5/2016 |
| JP | 2016121921 A | 7/2016 |
| JP | 2017191017 A | 10/2017 |
| JP | 2018138902 A | 9/2018 |
| WO | 2013046249 A1 | 4/2013 |

OTHER PUBLICATIONS

Office action dated May 24, 2022 from counterpart JP Patent Application No. 2020-553919, 3 pages.

* cited by examiner

ELECTROMAGNETIC WAVE GENERATION DEVICE AND ELECTROMAGNETIC WAVE GENERATION SYSTEM

CROSS-REFERENCE TO RELATED APPLICATIONS

This application is a U.S. National Stage entry of PCT Application No: PCT/JP2019/042275 filed Oct. 29, 2019, which claims priority to Japanese Patent Application No. 2018-203595 filed Oct. 30, 2018, the contents of which are incorporated herein by reference.

TECHNICAL FIELD

The present invention relates to an electromagnetic wave generation device and an electromagnetic wave generation system.

BACKGROUND ART

For example, a device such as an X-ray inspection device that performs non-destructive inspection or the like using an electromagnetic wave is known. Such a device includes a transmitter that transmits an electromagnetic wave and a receiver that receives the electromagnetic wave, and detects presence of an inspection object by transmitting the electromagnetic wave from the transmitter toward the inspection object and receiving a signal passed through or reflected from the inspection object by the receiver.

SUMMARY OF THE INVENTION

Technical Problem

Incidentally, in recent years, expectations for using terahertz waves as the electromagnetic waves in the devices described above are increased. As an electromagnetic wave generation element that generates the terahertz wave, for example, a resonant tunneling diode (hereinafter, referred to as an RTD) is known. The electromagnetic wave generation element such as the RTD has low conversion efficiency of an electric power of the output (or generated) electromagnetic wave with respect to electric power input by applying a bias voltage, and the output per one element is low. Therefore, when it is assumed that the above-described element is used for technologies such as non-destructive inspection, it is necessary to cause a plurality of electromagnetic wave generation elements to oscillate at the same time to increase the total output. Along with this, as the number of electromagnetic wave generation elements oscillated at the same time increases for increasing the total output, the electric power consumed at the same time increases.

In an electromagnetic wave generation device including a plurality of electromagnetic wave generation elements, to reduce the instantaneous maximum power consumption during the generation operation of the electromagnetic waves is an example of an object to solve the problem using the present invention.

Solution to Problem

The invention disclosed in claim 1 is
an electromagnetic wave generation device including a plurality of electromagnetic wave generation elements that are divided into a plurality of groups, and
a control unit that causes the plurality of electromagnetic wave generation elements to oscillate while shifting a timing in units of group.

The invention disclosed in claim 13 is
the electromagnetic wave generation device according to any one of claims 1 to 12; and
an electromagnetic wave detection device that operates a plurality of electromagnetic wave detection elements divided into a plurality of groups while shifting a timing in units of group, and detects electromagnetic waves generated by the plurality of electromagnetic wave generation elements.

BRIEF DESCRIPTION OF THE DRAWINGS

The object described above and other objects, features, and advantages will be further clarified by the preferred embodiments described below and the accompanying drawings below.

DESCRIPTION OF EMBODIMENTS

Overview

Figure 1:
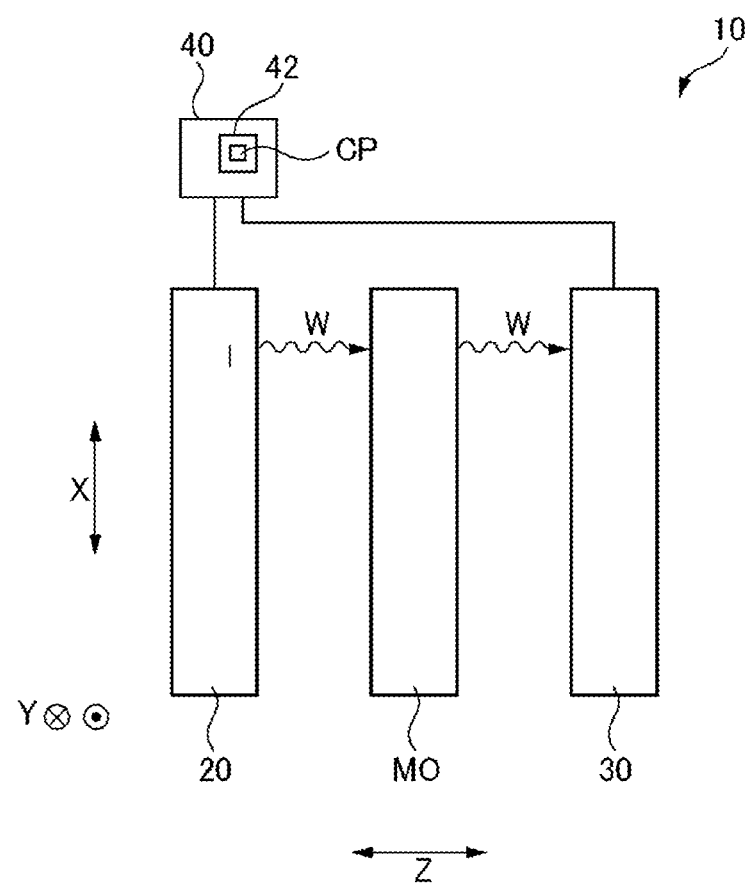
FIG. 1 is a schematic diagram of an electromagnetic wave generation system in a first embodiment.

Hereinafter, as examples of the present invention, a first embodiment, a second embodiment, a third embodiment, and a plurality of modification examples will be described with reference to the drawings. In all the reference drawings, the same reference numerals will be given to the configuration elements having the same function, and the description thereof will not be repeated in the specification.

First Embodiment

Hereinafter, the first embodiment will be described with reference to the drawings. First, functions and configurations of an electromagnetic wave generation system 10 (refer to FIG. 1 and FIG. 5) in the present embodiment will be described. Subsequently, the operation by the electromagnetic wave generation system 10 in the present embodiment will be described. Next, an effect of the present embodiment will be described.

Figure 5:
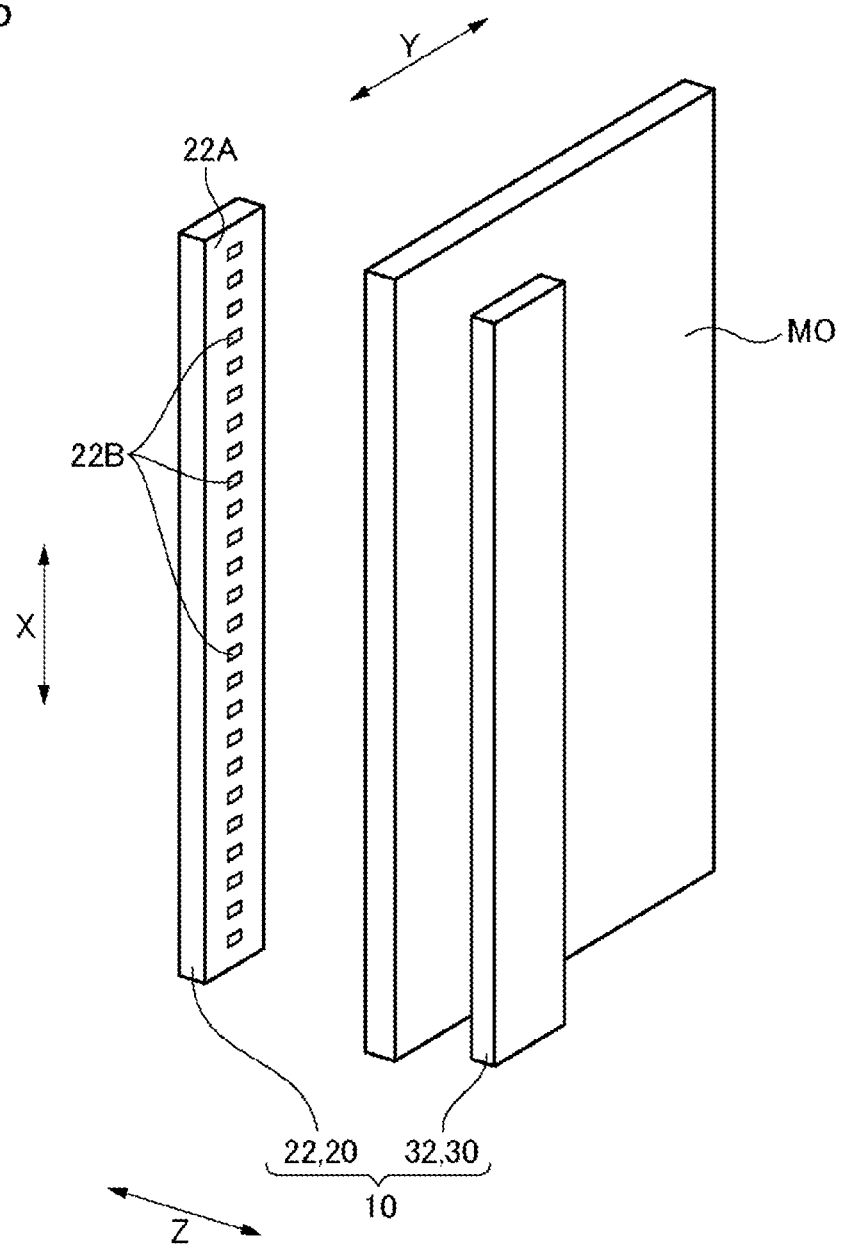
FIG. 5 is a schematic diagram illustrating a state in which a measurement target object is measured by using the electromagnetic wave generation system in the first embodiment.

Functions and Configurations of Electromagnetic Wave Generation System in First Embodiment FIG. 1 is a schematic diagram of the electromagnetic wave generation system 10 in the present embodiment. FIG. 5 is a schematic diagram illustrating a state in which a measurement target object MO is measured by using the electromagnetic wave generation system 10 in the present embodiment. The electromagnetic wave generation system 10 includes an electromagnetic wave generation device 20, an electromagnetic wave detection device 30, and a control device 40 (an example of a control unit). As an example, the electromagnetic wave generation system 10 has functions of causing the electromagnetic wave generation device 20 to generate an electromagnetic wave W toward the measurement target object MO, to cause the electromagnetic wave detection device 30 to detect the electromagnetic wave W passed through or reflected from the measurement target object MO, and to cause the control device 40 to analyze a shape of the measurement target object MO.

[Electromagnetic Wave Generation Device and Control Device]

Figure 2:
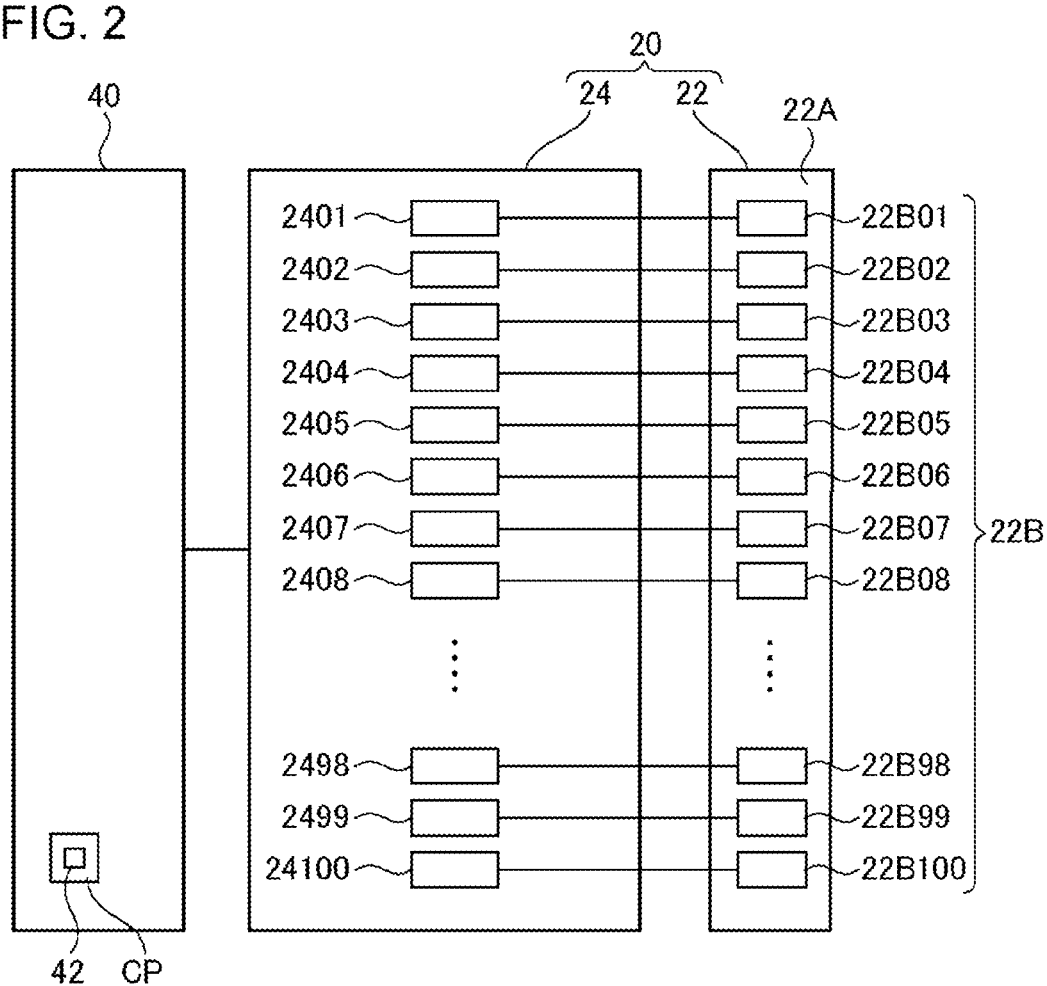
FIG. 2 is a schematic diagram of an electromagnetic wave generation device and a control device in the first embodiment.

FIG. 2 is a schematic diagram of the electromagnetic wave generation device 20 and the control device 40. The electromagnetic wave generation device 20 includes an electromagnetic wave generation unit 22 and a bias voltage generation unit 24 (hereinafter, referred to as a voltage generation unit 24). The electromagnetic wave generation unit 22 is connected to the voltage generation unit 24, and the voltage generation unit 24 is connected to the control device 40.

(Electromagnetic Wave Generation Unit)

Figure 3:
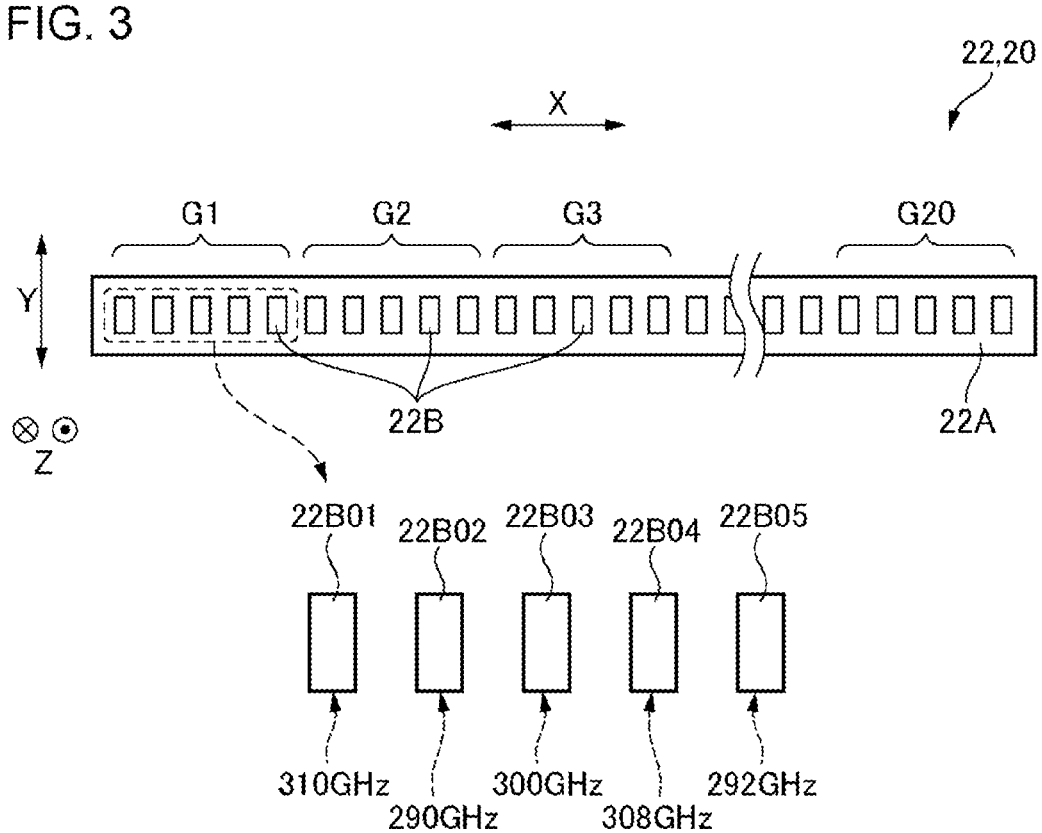
FIG. 3 is a schematic diagram of an electromagnetic wave generation unit in the first embodiment.

FIG. 3 is a schematic diagram of the electromagnetic wave generation unit 22. The electromagnetic wave generation unit 22 includes a substrate 22A and a plurality of electromagnetic wave generation elements 22B.

As an example, the substrate 22A is made long as illustrated in FIG. 3. In the description below, the longitudinal direction (an example of the straight-line direction) of the substrate 22A is the X direction, the lateral direction is the Y direction, and the thickness direction is the Z direction. The substrate 22A is a so-called printed wiring substrate on which wiring patterns are formed for mounting a plurality of electromagnetic wave generation elements 22B and for coupling output terminals (not illustrated) of the voltage generation unit 24.

In the present embodiment, the quantity N of the plurality of electromagnetic wave generation elements 22B is set to 100 as an example. Here, each electromagnetic wave generation element included in the plurality of electromagnetic wave generation elements 22B is referred to as electromagnetic wave generation elements 22B01, 22B02, 22B03, . . . , 22B98, 22B99, and 22B100. As illustrated in FIG. 3, the electromagnetic wave generation elements 22B01, 22B02, 22B03, 22B98, 22B99, and 22B100 are mounted on a surface of the substrate 22A in a state of being arranged in the listed order from one end side to the other end side in the X direction.

In the description in the present embodiment, the quantity N is set to 100 for convenience, but the quantity N does not need to be 100 as long as it is equal to or larger than 3. For example, the quantity N may be equal to or larger than 3, or may be smaller than 100 or more than 100.

The electromagnetic wave generation unit 22 can move within a predetermined range in the Y direction under a control by the control device 40 during the operation by the electromagnetic wave generation system 10 (refer to FIG. 5). Therefore, the electromagnetic wave generation device 20 includes a drive mechanism (not illustrated) for moving the electromagnetic wave generation unit 22.

Each of the plurality of electromagnetic wave generation elements 22B is an element that generates a terahertz wave. As an example, each of the plurality of electromagnetic wave generation elements 22B is a resonant tunneling diode that generates the electromagnetic wave W having a center frequency of approximately 300 GHz (hereinafter, referred to as an oscillation frequency in the present specification). The plurality of electromagnetic wave generation elements 22B do not need to be the resonant tunneling diodes as long as they are elements that generate terahertz waves.

Here, the terahertz wave is said to be an electromagnetic wave having a shorter wavelength than millimeter waves and a longer wavelength than infrared rays. The terahertz waves are electromagnetic waves that have the properties of both light waves and radio waves, for example, having the properties of passing through (or easily passing through) cloth, paper, wood, plastic, ceramics, and the like, and not passing through (or unlikely to pass through) metals, water, and the like. Generally, the frequency of the terahertz wave is also said to be an electromagnetic wave of around 1 THz (a corresponding wavelength of around 300 μm), but there is generally no clear definition of the range. Therefore, in the present specification, the wavelength range of the terahertz wave is defined as a range of equal to or higher than 70 GHz and equal to or lower than 10 THz.

As described above, the oscillation frequency of the plurality of electromagnetic wave generation elements 22B in the present embodiment is set to be around 300 GHz as an example. However, as long as the oscillation frequency is a frequency in the terahertz wave band, that is, as long as the oscillation frequency is within the range of equal to or higher than 70 GHz and equal to or lower than 10 THz, the oscillation frequency of the plurality of electromagnetic wave generation elements 22B does not need to be around 300 GHz.

As illustrated in FIG. 3, the plurality of electromagnetic wave generation elements 22B in the present embodiment are divided into a plurality of (20) groups as an example. In the present embodiment, each group which is a result of being divided into 20 groups is referred to as a first group G1, a second group G2, a third group G3, . . . , an 18th group G18, a 19th group G19, and a 20th group G20 in an arrangement order from one end side to the multiple end side in the X direction. As an example, each group is configured by a combination of a plurality (five) of electromagnetic wave generation elements 22B. The technical meaning of dividing a plurality of electromagnetic wave generation elements 22B into a plurality of groups will be described in the description of the operation by the electromagnetic wave generation system 10 in the present embodiment described later.

In the description in the present embodiment, for convenience, the number n of the plurality of groups is 20 and the quantity of the plurality of electromagnetic wave generation elements 22B configuring each group is 5. However, as long as the number of the plurality of electromagnetic wave generation elements 22B configuring each group is equal to or more than two, the number n of the plurality of groups does not need to be 20.

All the electromagnetic wave generation elements 22B01, 22B02, 22B03, 22B04, and 22B05 configuring the first group G1 are assumed to be the elements that oscillate at the oscillation frequency of 310 GHz, 290 GHz, 300 GHz, 308 GHz, and 292 GHz, respectively. That is, the electromagnetic wave generation elements 22B01, 22B02, 22B03, 22B04, and 22B05 in the first group G1 oscillate at different oscillation frequencies when the same bias voltage is applied. In addition, an average value of the oscillation frequencies of all the electromagnetic wave generation elements 22B01, 22B02, 22B03, 22B04, and 22B05 configuring the first group G1 is 300 GHz, a maximum value of the oscillation frequencies is 310 GHz, and a minimum value of the oscillation frequencies is 290 GHz. That is, a difference between the maximum value and the minimum value of the oscillation frequencies of the first group G1 is 20 GHz (=310 GHz−290 GHz).

Here, in a case of each group of the second group G2 to the 20th group G20 also, similarly to the first group, all the electromagnetic wave generation elements 22B configuring each group are configured with the elements that oscillate at different oscillation frequencies. However, the average value and the difference between the maximum value and the minimum value of the oscillation frequencies in each group of the second group G2 to the 20th group G20 does not need to be the same as those in the case of the first group G1. Specifically, the average value of the oscillation frequencies of each group may be around 300 GHz as an example, and the difference between the maximum value and the minimum value of the oscillation frequencies of each group may be equal to or larger than 1 GHz and equal to or smaller than 100 GHz an example.

(Bias Voltage Generation Unit)

Next, the voltage generation unit 24 will be described with reference to FIG. 2.

The voltage generation unit 24 has a function of applying a bias voltage to a plurality of electromagnetic wave generation elements 22B for the plurality of electromagnetic wave generation elements 22B to oscillate, under the control of the control device 40. The voltage generation unit 24 is configured with individual power supply units 2401, 2402, 2403, . . . , 2498, 2499, and 24100. The individual power supply units 2401, 2402, 2403, . . . , 2498, 2499, 24100 are connected to the electromagnetic wave generation elements 22B01, 22B02, 22B03, 22B98, 22B99, 22B100, respectively. That is, the voltage generation unit 24 in the present embodiment individually applies the bias voltage to the electromagnetic wave generation elements 22B01, 22B02, 22B03, 22B98, 22B99, 22B100 of the electromagnetic wave generation unit 22. The individual power supply units 2401, 2402, 2403, . . . , 2498, 2499, and 24100 in the present embodiment are set such that the bias voltage of the same magnitude is output at a predetermined timing under the control by the control device 40 (refer to FIG. 6).

(Control Device)

Next, the control device 40 will be described with reference to FIG. 1 and FIG. 2.

The control device 40 has a function of controlling the electromagnetic wave generation device 20, a function of controlling the electromagnetic wave detection device 30, and a function of analyzing a shape of the measurement target object MO or the like based on a result of detection of the electromagnetic wave W performed by the electromagnetic wave detection device 30.

The control device 40 includes a storage unit 42. In the storage unit 42, a control program CP for the control device 40 to control the electromagnetic wave generation device 20 and the electromagnetic wave detection device 30 and to perform a measuring operation on the measurement target object MO is stored. The control device 40 controls the electromagnetic wave generation device 20 and the electromagnetic wave detection device 30 according to the control program CP, and performs the measuring operation on the measurement target object MO. The specific function of the control device 40 will be described in the description of the operation by the electromagnetic wave generation system 10 in the present embodiment described later.

[Electromagnetic Wave Detection Device]

Next, the electromagnetic wave detection device 30 will be described with reference to FIG. 1 and FIG. 4.

As illustrated in FIG. 1, the electromagnetic wave detection device 30 has a function of detecting the electromagnetic wave W that is generated by the electromagnetic wave generation device 20 toward the measurement target object MO and passed through or reflected from the measurement target object MO.

Figure 4:
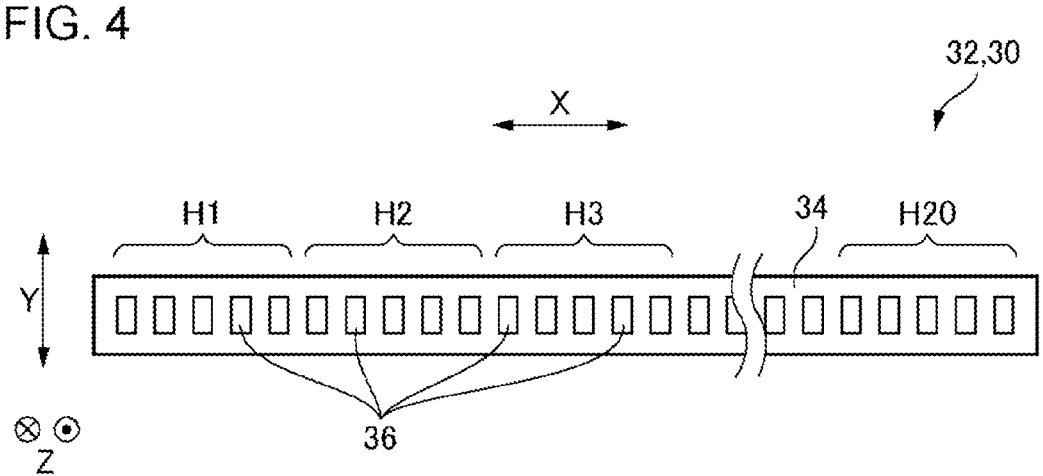
FIG. 4 is a schematic diagram of the electromagnetic wave detection unit configuring the electromagnetic wave detection device in the first embodiment.

As illustrated in FIG. 4, the electromagnetic wave detection device 30 includes an electromagnetic wave detection unit 32 and a drive mechanism (not illustrated) as an example. The electromagnetic wave detection unit 32 includes a long substrate 34 and a plurality of electromagnetic wave detection elements 36. The long substrate 34 is a printed wiring substrate, and is arranged so as to face the electromagnetic wave generation unit 22 with the longitudinal direction along the X direction (refer to FIG. 1 and FIG. 5). The plurality of electromagnetic wave detection elements 36 are mounted on the surface of the substrate 34 facing the electromagnetic wave generation unit 22 in a state of being arranged from one end side to the other end side in the X direction of the substrate 34. That is, the electromagnetic wave detection unit 32 faces the electromagnetic wave generation unit 22 in a state of being along the same direction as the electromagnetic wave generation unit 22. The quantity of the plurality of electromagnetic wave detection elements 36 is the same as the quantity N of the plurality of electromagnetic wave generation elements 22B, that is, 100 in the case of the present embodiment.

In addition, as illustrated in FIG. 4, the plurality of electromagnetic wave detection elements 36 are divided into a plurality (20) of groups. In the present embodiment, each group which is a result of being divided into 20 groups is referred to as a first group H1, a second group H2, a third group H3, . . . , an 18th group H18, a 19th group H19, and a 20th group H20 in an arrangement order from one end side to the multiple end side in the X direction. Each group is configured by a combination of a plurality (five) of electromagnetic wave detection elements 36 as an example. In the description in the present embodiment, the quantity of the plurality of electromagnetic wave detection elements 36 is set to 100, which is the same as the quantity N of the plurality of electromagnetic wave generation elements 22B, but it does not need to be 100 as long as the quantity is the same as the quantity N of the plurality of electromagnetic wave generation elements 22B. The technical meaning of dividing a plurality of electromagnetic wave detection elements 36 into a plurality of groups will be described in the description of the operation by the electromagnetic wave generation system 10 in the present embodiment described later.

As an example, the plurality of electromagnetic wave detection elements 36 are the resonant tunneling diodes capable of detecting the electromagnetic wave W generated by the plurality of electromagnetic wave generation elements 22B. However, the plurality of electromagnetic wave detection elements 36 may not be the resonant tunneling diodes as long as they are the elements capable of detecting the terahertz waves.

The drive mechanism (not illustrated) has a function of moving the electromagnetic wave detection unit 32 in the Y direction within a predetermined range under the control by the control device 40 during the operation by the electromagnetic wave generation system 10 (refer to FIG. 5).

The above is the description of the function and configuration of the electromagnetic wave generation system 10 in the first embodiment.

Operation of Electromagnetic Wave Generation System in First Embodiment

Next, the operation by the electromagnetic wave generation system 10 in the present embodiment (measuring operation for the measurement target object MO) will be described with reference to FIG. 1 to FIG. 6. In the description below, an example of the measurement target object MO is a metal member (not illustrated) accommodated in a paper envelope.

In an initial state, the electromagnetic wave generation unit 22 and the electromagnetic wave detection unit 32 face each other in the Z direction and are at a predetermined position in the Y direction (a position that is one end in the Y direction within a range of being movable in the Y direction). FIG. 5 is a diagram illustrating a state in which the electromagnetic wave generation unit 22 and the electromagnetic wave detection unit 32 are positioned at the positions in the initial state.

First, as illustrated in FIG. 1, a measurer sets the measurement target object MO at a position between the electromagnetic wave generation device 20 and the electromagnetic wave detection device 30. In this case, the measurement target object MO is arranged along the thickness direction Z direction (the direction facing the electromagnetic wave generation unit 22 and the electromagnetic wave detection unit 32). Next, when the measurer turns on the operation switch (not illustrated) of the electromagnetic wave generation system 10, the control device 40 starts to control the electromagnetic wave generation device 20 and the electromagnetic wave detection device 30 according to the control program CP stored in the storage unit 42. After the start of control, the electromagnetic wave generation system 10 operates as follows.

Figure 6:
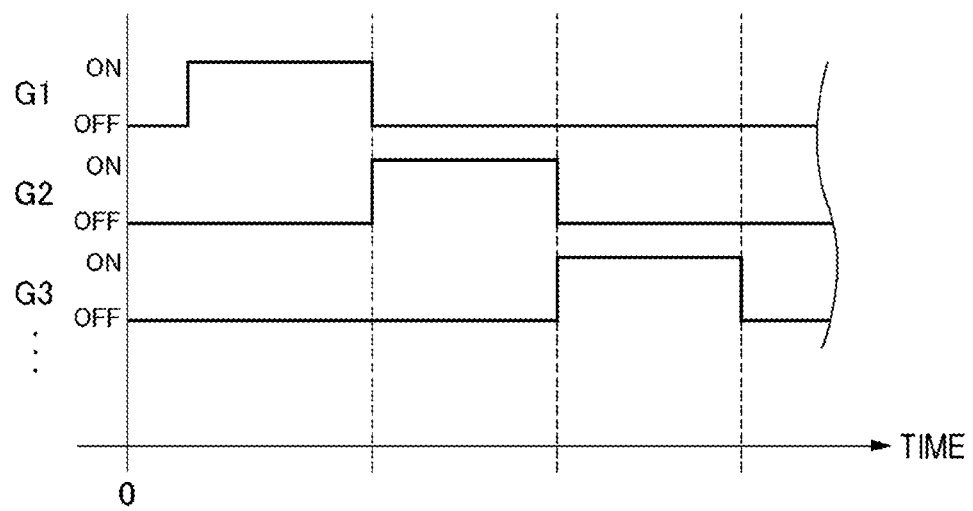
FIG. 6 is a timing chart of an oscillation operation by a plurality of groups divided into a plurality of groups during the operation by the electromagnetic wave generation system in the first embodiment.

First, the control device 40 controls the individual power supply units 2401 to 2405 of the voltage generation unit 24, and causes the individual power supply units 2401 to 2405 to output a bias voltage of the same magnitude for a predetermined period (refer to FIG. 1 and FIG. 6). Along with this, the electromagnetic wave generation elements 22B01 to 22B05 that configure the first group G1 of the electromagnetic wave generation unit 22 respectively oscillate at the oscillation frequencies of 310 GHz, 290 GHz, 300 GHz, 308 GHz, and 292 GHz for a predetermined period (refer to FIG. 3). Along with this, the electromagnetic wave W generated from the first group G1 is emitted toward the electromagnetic wave detection unit 32 side in the Z direction (refer to FIG. 1). Then, among the electromagnetic wave W generated from the first group G1, the electromagnetic wave W incident on the metal member is reflected from the metal member, and the electromagnetic wave W incident only on the envelope passes through the envelope along the Z direction (refer to FIG. 1).

In addition, during the oscillation period of the first group G1, the control device 40 controls the five electromagnetic wave detection elements 36 configuring the first group H1 of the electromagnetic wave detection unit 32, and causes the five electromagnetic wave detection elements 36 configuring the first group H1 to detect the electromagnetic wave W that has passed through the envelope (refer to FIG. 1 and FIG. 4). Then, the control device 40 causes the electromagnetic wave detection unit 32 to transmit information on the electromagnetic wave W detected by the first group H1 of the electromagnetic wave detection unit 32 to the control device 40. The transmitted information on the electromagnetic wave W is stored in the storage unit 42.

Next, the control device 40 controls the individual power supply units 2406 to 2410 of the voltage generation unit 24, and causes the individual power supply units 2406 to 2410 to output the bias voltage of the same magnitude for a predetermined period (FIG. 1 and FIG. 6). Along with this, the electromagnetic wave generation elements 22B06 to 22B10 configuring the second group G2 of the electromagnetic wave generation unit 22 oscillates at the different oscillation frequencies for a predetermined period.

In addition, during the oscillation period of the second group G2, the control device 40 controls the five electromagnetic wave detection elements 36 configuring the second group H2 of the electromagnetic wave detection unit 32, and causes the five electromagnetic wave detection elements configuring the second group H2 to detect the electromagnetic wave W that has passed through the envelope (refer to FIG. 1 and FIG. 4). Then, the control device 40 causes the electromagnetic wave detection unit 32 to transmit the information on the electromagnetic wave W detected by the second group H2 of the electromagnetic wave detection unit 32 to the control device 40. The transmitted information on the electromagnetic wave W is stored in the storage unit 42.

Next, the control device 40 causes the third group G3 to the 20th group G20 of the electromagnetic wave generation unit 22 to perform the same operations as the first group G1 and the second group G2 described above together with each of the third group H3 to 20th group H20 of the electromagnetic wave detection unit 32. That is, the control device 40 controls the electromagnetic wave generation device 20 and the electromagnetic wave detection device 30 to oscillate while shifting the timing in a basis of group unit of the plurality of electromagnetic wave generation elements 22B (see FIG. 6). Along with this, the storage unit 42 of the control device 40 stores the information on the electromagnetic wave W at the initial position in the Y direction of the measurement target object MO. In the explanation below, the operation by the control device 40 for causing a plurality of electromagnetic wave generation elements 22B to oscillate at a predetermined position in the Y direction while shifting the timing in units of group is referred to as a basic scanning operation. In this case, the electromagnetic wave detection device 30 causes the control device 40 to operate the plurality of electromagnetic wave detection elements 36 while shifting the timing in units of group, and detects the electromagnetic wave W generated by the plurality of electromagnetic wave generation elements 22B.

Here, in other words, the basic scanning operation in the present embodiment can be defined as follows. That is, the basic scanning operation is an operation by the control device 40 for causing the plurality of electromagnetic wave generation elements 22B to oscillate such that the oscillation start timing of the group that performs the mth oscillation (m is a natural number equal to or larger than 2 and equal to or smaller than n) is the same as the oscillation end timing of the group that performs the (m−1)th oscillation when the number of the plurality of groups is n.

Next, the control device 40 controls the drive mechanism of the electromagnetic wave generation device 20 and the drive mechanism of the electromagnetic wave detection device 30, and causes the electromagnetic wave generation unit 22 and the electromagnetic wave detection unit 32 to respectively move from one end side to the other end side in the Y direction by a predetermined distance. After that, the control device 40 controls the electromagnetic wave generation device 20 and the electromagnetic wave detection device 30, and causes the electromagnetic wave generation unit 22 and the electromagnetic wave detection unit 32 to perform the basic scanning operation.

Next, the control device 40 further causes the electromagnetic wave generation unit 22 and the electromagnetic wave detection unit 32 to move from one end side to the other end side in the Y direction by a predetermined distance, respectively, and causes the electromagnetic wave generation unit 22 and the electromagnetic wave detection unit 32 to perform the basic scanning operation. The control device 40 causes the electromagnetic wave generation device 20 and the electromagnetic wave detection device 30 to repeatedly perform the movement of the electromagnetic wave generation unit 22 and the electromagnetic wave detection unit 32 and the basic scanning operation. Then, among the movable range in the Y direction of the electromagnetic wave generation unit 22 and the electromagnetic wave detection unit 32, when the basic scanning operation at the position at the other end in the Y direction is completed, the control device 40 moves the electromagnetic wave generation unit 22 and the electromagnetic wave detection unit 32 to the initial positions (refer to FIG. 5).

When the basic scanning operation at the position at the other end in the Y direction is completed, the information (one-dimensional information at each position in the Y direction) relating to the electromagnetic wave W transmitted from the electromagnetic wave detection unit 32 after each basic scanning operation is stored in the storage unit 42 of the control device 40. The control device 40 combines the one-dimensional information at each position in the Y direction and converts the one-dimensional information into a two-dimensional image in the movement range in the Y direction according to the control program CP. As a result, a portion of the paper envelope in which the metal member is accommodated and a portion in which the metal member is not accommodated are displayed on a monitor (not illustrated) as a binary image, for example. In this way, the shape of the measurement target object MO (in case of the present embodiment, the shape of the metal member) is analyzed.

After that, when the control device 40 moves the electromagnetic wave generation unit 22 and the electromagnetic wave detection unit 32 to the initial positions by the drive mechanism, the measuring operation of the measurement target object MO by the electromagnetic wave generation system 10 in the present embodiment is completed.

The above is the description of the operation of the electromagnetic wave generation system 10 in the first embodiment.

Effects of First Embodiment

Next, effects (first to sixth effects) of the present embodiment will be described with reference to the drawings.

[First Effect]

A first effect is an effect of causing a plurality of electromagnetic wave generation elements 22B divided into a plurality of groups to oscillate while shifting the timing in units of group.

For example, in a case of a form in which all of the plurality of electromagnetic wave generation elements 22B oscillate at the same time, the instantaneous maximum power consumption (maximum value of the instantaneous electric power consumption) during the generation operation of the electromagnetic wave is a sum of the electric power consumption of all the electromagnetic wave generation elements 22B.

On the other hand, the electromagnetic wave generation device 20 in the present embodiment causes a plurality of electromagnetic wave generation elements 22B divided into a plurality of groups to oscillate while shifting the timing in units of group (refer to FIG. 3 and FIG. 6). Therefore, in a case of the electromagnetic wave generation device 20 in the present embodiment, the instantaneous maximum power consumption is a sum of the electric power consumptions of a plurality of electromagnetic wave generation elements 22B that configure each group.

Therefore, the electromagnetic wave generation device 20 in the present embodiment can reduce the instantaneous maximum power consumption during the generation operation of the electromagnetic wave compared to the form in which all of the plurality of electromagnetic wave generation elements 22B oscillate at the same time. Accordingly, the electromagnetic wave generation system 10 in the present embodiment can reduce the instantaneous maximum power consumption during the measuring operation of the measurement target object MO.

This effect becomes more remarkable when the plurality of electromagnetic wave generation elements 22B are elements that oscillate the so-called terahertz waves.

[Second Effect]

A second effect is an effect of a fact that at least one electromagnetic wave generation element 22B included in the same group oscillates at an oscillation frequency different from that of another electromagnetic wave generation element 22B.

For example, if all the electromagnetic wave generation elements 22B included in each group oscillate at the same oscillation frequency without the phase difference, the electromagnetic waves W emitted from each electromagnetic wave generation element 22B have a coherent relationship. Therefore, the electromagnetic waves W emitted from each electromagnetic wave generation element 22B are likely to interfere with each other. On the other hand, all the electromagnetic wave generation elements 22B included in each group in the present embodiment have different oscillation frequencies (refer to FIG. 3).

Therefore, in the electromagnetic wave generation device 20 in the present embodiment, the electromagnetic waves W emitted from each electromagnetic wave generation element 22B do not interfere with each other (or unlikely to interfere each other), compared to the configuration in which all the electromagnetic wave generation elements 22B included in the group oscillate at the same oscillation frequency without the phase difference.

In order to explain this effect, even in the case of "the form in which all the electromagnetic wave generation elements 22B included in the group oscillate at the same oscillation frequency without the phase difference", which is the comparison target, it can be said to be a configuration that achieves the first effect. From this point, it can be said that "the configuration in which all the electromagnetic wave generation elements 22B included in the group oscillate at the same oscillation frequency without the phase difference" is included in the technical scope of the present invention.

[Third Effect]

A third effect is an effect of a fact that the difference between the maximum value and the minimum value of the oscillation frequencies of a plurality of electromagnetic wave generation elements 22B included in the same group is equal to or larger than 1 GHz and equal to or smaller than 100 GHz.

In the comparative form for the second effect, since all the electromagnetic wave generation elements 22B oscillate at the same oscillation frequency, the difference between the maximum value and the minimum value of the oscillation frequencies of the plurality of electromagnetic wave generation elements 22B is 0 GHz (<1 GHz). In the case of this comparative form, as described above, the electromagnetic waves W may interfere with each other.

In addition, in the case where the difference between the maximum value and the minimum value of the oscillation frequencies of a plurality of electromagnetic wave generation elements 22B is larger than 100 GHz, the detection accuracy of the electromagnetic wave W by the electromagnetic wave detection unit 32 becomes low.

On the other hand, in the case of the present embodiment, the difference between the maximum value and the minimum value of the oscillation frequencies of a plurality of electromagnetic wave generation elements 22B included in the same group is equal to or larger than 1 GHz and equal to or smaller than 100 GHz.

Therefore, in the present embodiment, the electromagnetic waves W are less likely to interfere with each other compared to the form in which the difference between the maximum value and the minimum value of the oscillation frequencies of the plurality of electromagnetic wave generation elements 22B is smaller than 1 GHz, and the detection accuracy of the electromagnetic wave W by the electromagnetic wave detection unit 32 is higher than that of the form in which the difference is larger than 100 GHz.

[Fourth Effect]

A fourth effect is an effect of a fact that each group of the electromagnetic wave generation unit 22 is configured by a combination of a plurality of electromagnetic wave generation elements 22B continuously arranged among a plurality of electromagnetic wave generation elements 22B.

In case of the present embodiment, a plurality of electromagnetic wave generation elements 22B of each group are continuously arranged along the X direction (refer to FIG. 3). In other words, the plurality of electromagnetic wave generation elements 22B configuring each group generate the electromagnetic waves W in a mass.

Figure 13:
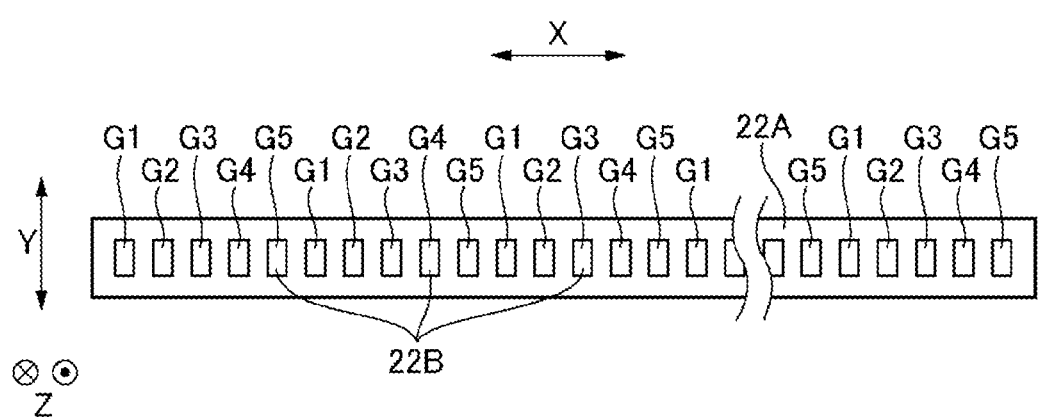
FIG. 13 is a schematic diagram of an electromagnetic wave generation unit in a fourth modification example.

Therefore, the electromagnetic wave generation device 20 in the present embodiment can make the electromagnetic wave W emitted from the plurality of electromagnetic wave generation elements 22B be incident on the measurement target object MO in a concentrative manner compared to a form of discontinuous arrangement along the X direction (for example, refer to the third modification example in FIG. 13). Accordingly, the electromagnetic wave generation system 10 in the present embodiment has a high accuracy of measurement of the measurement target object MO.

The above is the effect of the first embodiment. The above is the description of the first embodiment.

Second Embodiment

Figure 7:
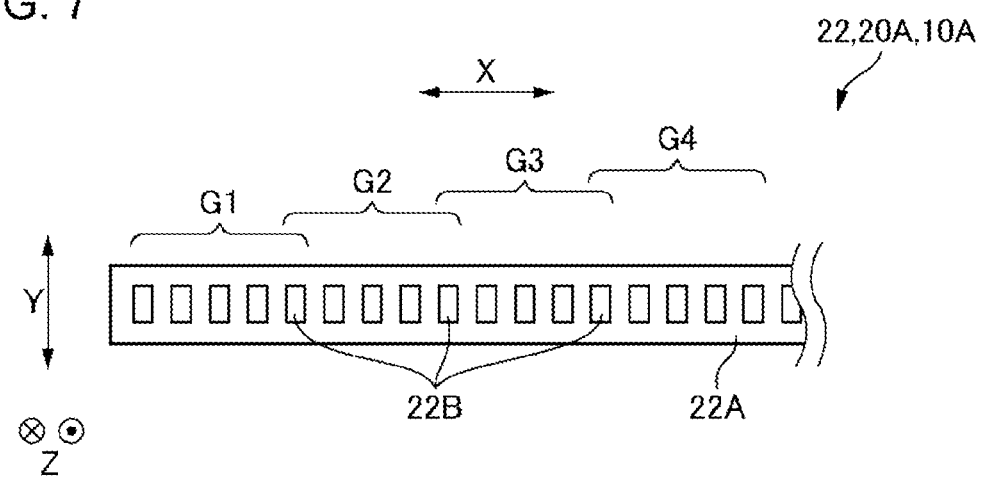
FIG. 7 is a schematic diagram of an electromagnetic wave generation unit in a second embodiment.

Next, a second embodiment will be described with reference to FIG. 7. Regarding the present embodiment, only the part different from that in the first embodiment will be described. In the description of the present embodiment, for the configuration elements and the like same as those in the first embodiment, the same names, symbols, and the like will be used.

An electromagnetic wave generation system 10A in the present embodiment is different from the case of the first embodiment in a point of grouping of a plurality of electromagnetic wave generation elements 22B included in the electromagnetic wave generation unit 22 of an electromagnetic wave generation device 20A. Specifically, as illustrated in FIG. 7, the electromagnetic wave generation element 22B at the other end side in the X direction in the first group G1 also serves as the electromagnetic wave generation element 22B at one end side in the X direction in the second group G2. Similarly, the electromagnetic wave generation element 22B at the other end side in the X direction in the second group G2 also serves as the electromagnetic wave generation element 22B at the one end side in the X direction in the third group G3. That is, a part of the electromagnetic wave generation element 22B in the mth group (m is a natural number of equal to or larger than 1) also serves as a part of the electromagnetic wave generation element 22B in the (m+1)th group. The above is the description of a part different from the case of the first embodiment in the present embodiment (refer to FIG. 3).

Due to the above configuration, in the case of the present embodiment, the electromagnetic wave generation element 22B at one end side in the X direction and the electromagnetic wave generation element 22B at the other end side of each group generate the electromagnetic wave W for a period twice as long as that in the first embodiment. Therefore, in the present embodiment, the detection accuracy of the electromagnetic wave W at the joint (boundary) portion of each group can be improved.

Other effects of the present embodiment are the same as those in the first embodiment.

The above is the description of the second embodiment.

Third Embodiment

Figure 8:
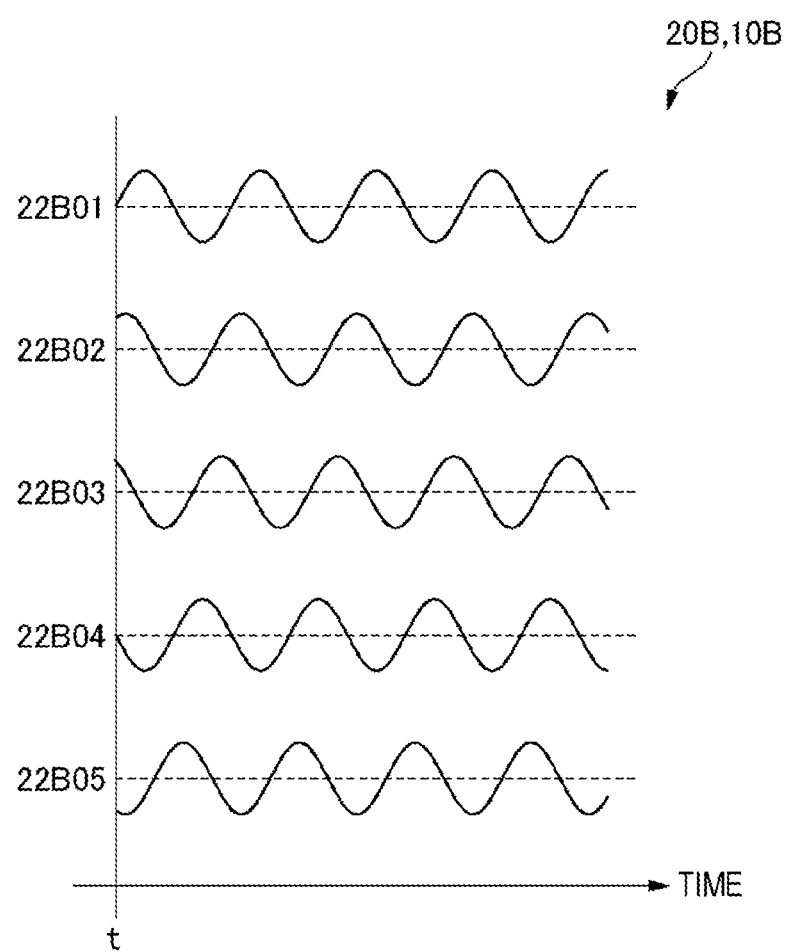
FIG. 8 is a diagram illustrating a waveform of each electromagnetic wave generated from electromagnetic wave generation elements in each group in a third embodiment.

Next, a third embodiment will be described with reference to FIG. 8. Regarding the present embodiment, only the part different from that in the first embodiment will be described. In the description of the present embodiment, for the configuration elements and the like same as those in the first embodiment, the same names, symbols, and the like will be used.

In an electromagnetic wave generation system 10B in the present embodiment, all of a plurality of electromagnetic wave generation elements 22B configuring each group of the electromagnetic wave generation unit 22 of an electromagnetic wave generation device 20B have the same oscillation frequency. In addition, in case of the present embodiment, the control device 40 causes all the electromagnetic wave generation elements 22B of each group to oscillate in different phases. The above is the description of a part different from the case of the first embodiment in the present embodiment. In the present specification, the "the same oscillation frequency" means, for example, a frequency in the range of equal to or higher than 99.5% and equal to or lower than 100.5% of the oscillation frequency A compared to the oscillation frequency A.

Here, in the case of "the form in which all the electromagnetic wave generation elements 22B included in the group oscillate at the same oscillation frequency without the phase difference" which is used as the comparative form of the second effect in the description of the effect of the first embodiment, the electromagnetic waves W emitted from each electromagnetic wave generation element 22B are likely to interfere with each other.

On the other hand, in a case of the present embodiment, all the electromagnetic wave generation elements 22B in the same group have the same oscillation frequency, but oscillate in different phases. The graph in FIG. 8 showing the phase difference is, for example, a model graph of the electromagnetic wave generation elements 22B01 to 22B05 that configure the first group G1.

Therefore, in the electromagnetic wave generation device 20B in the present embodiment, the electromagnetic waves W emitted from each electromagnetic wave generation element 22B are unlikely to interfere with each other (or do not interfere with each other) compared to the form in which all the electromagnetic wave generation elements 22B included in the group oscillate at the same oscillation frequency without the phase difference.

Other effects of the present embodiment are the same as those in the first embodiment.

The above is the description of the third embodiment.

Fourth Embodiment

Figure 9:
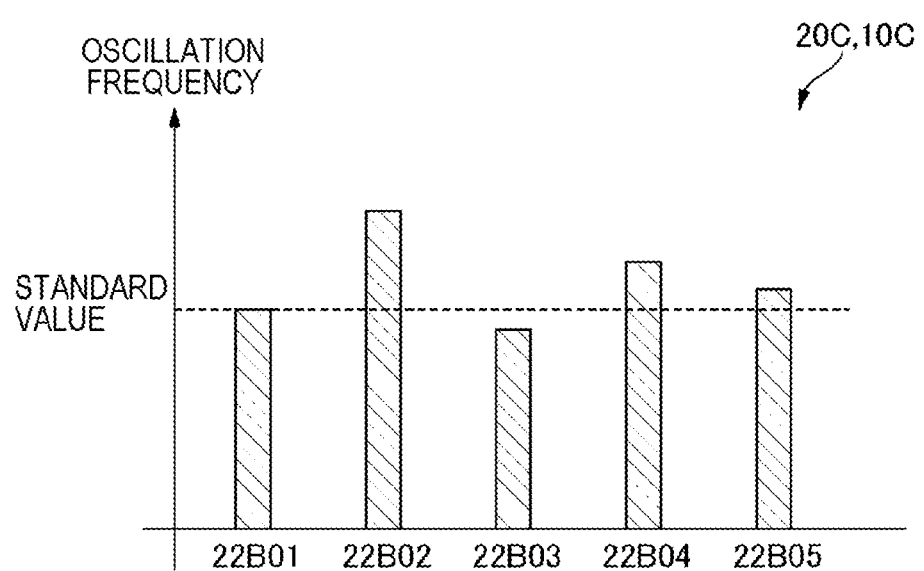
FIG. 9 illustrates an oscillation frequency of each electromagnetic wave generation element when different bias voltages are applied to all the electromagnetic wave generation elements having the same oscillation frequency and included in each group in the fourth embodiment.

Next, a fourth embodiment will be described with reference to FIG. 9. Regarding the present embodiment, only the part different from that in the first embodiment will be described. In the description of the present embodiment, for the configuration elements and the like same as those in the first embodiment, the same names, symbols, and the like will be used.

In an electromagnetic wave generation system 10C in the present embodiment, all of a plurality of electromagnetic wave generation elements 22B configuring each group in the electromagnetic wave generation unit 22 of the electromagnetic wave generation device 20C have the same oscillation frequency. That is, the plurality of electromagnetic wave generation elements 22B in the present embodiment oscillate at the same oscillation frequency when the same bias voltage is applied.

In addition, the voltage generation unit 24 of the electromagnetic wave generation device 20C of the electromagnetic wave generation system 10C in the present embodiment (refer to FIG. 2) is controlled by the control device 40, and different bias voltages are applied to each of the plurality of electromagnetic wave generation elements 22B configuring each group. Here, the voltage generation unit 24 in the present embodiment is an example of a voltage applying unit. The above is the description of a part different from the case of the first embodiment in the present embodiment.

Here, in the case of "the form in which all the electromagnetic wave generation elements 22B included in the group oscillate at the same oscillation frequency without the phase difference" which is used as the comparative form of the second effect in the description of the effect of the first embodiment, the electromagnetic waves W emitted from each electromagnetic wave generation element 22B are likely to interfere with each other. A standard value in graph in FIG. 9 indicates, as an example, the standard oscillation frequency (oscillation frequency when a predetermined bias voltage is applied) of all the electromagnetic wave generation elements 22B01 to 22B05 in the first group G1.

On the other hand, in the case of the present embodiment, the voltage generation unit 24 controlled by the control device 40 applies the different bias voltages to each of the plurality of electromagnetic wave generation elements 22B configuring each group. As a result, the plurality of electromagnetic wave generation elements 22B oscillate at different oscillation frequencies. The values indicated by the bars of each electromagnetic wave generation element 22B01 to 22B05 in the graph in FIG. 9 indicate the oscillation frequency when the different bias voltages are applied, respectively.

Therefore, in the electromagnetic wave generation device 20C in the present embodiment, the electromagnetic waves W emitted from each electromagnetic wave generation element 22B are unlikely to interfere with other (or do not interfere with other) compared to the form in which all the electromagnetic wave generation elements 22B included in the group oscillate at the same oscillation frequency.

Other effects of the present embodiment are the same as those in the first embodiment.

The above is the description of the fourth embodiment.

As described above, the present invention is described with reference to specific embodiments as the examples, but the present invention is not limited to these embodiments. The technical scope of the present invention also includes, for example, the following forms (modification examples).

For example, in the description in the first embodiment, it is assumed that the electromagnetic wave generation system 10 is a device that analyzes the shape or the like of the measurement target object MO using the electromagnetic wave W as an example.

However, as long as the electromagnetic wave is generated by causing a plurality of electromagnetic wave generation elements 22B to oscillate while shifting the timing in units of group, the electromagnetic wave generation system does not need to be a device that analyzes the shape or the like of the measurement target object MO. For example, the system may be various sensors, tomography or other systems. The modification example described above can also be applied to the second to fourth embodiments.

In addition, in the description in the first embodiment, in the plurality of groups in which the plurality of electromagnetic wave generation elements 22B are divided, the quantities of the plurality of electromagnetic wave generation elements 22B configuring each group are described as the same quantity. However, the quantities of the plurality of electromagnetic wave generation elements 22B configuring each group do not need to be the same. The modification example described above can also be applied to the second to fourth embodiments.

In addition, in the first embodiment, the period for causing the plurality of electromagnetic wave generation elements 22B configuring each group to oscillate (predetermined period) is described as the period of same length (see FIG. 6). However, as long as the electromagnetic wave is generated by causing a plurality of electromagnetic wave generation elements 22B to oscillate while shifting the timing in units of group, the oscillation period of each group may be the period of different length. The modification example described above can also be applied to the second to fourth embodiments.

In addition, in the description in the first embodiment, the control device 40 is a configuration element different from the electromagnetic wave generation device 20 and the electromagnetic wave detection device 30. However, among the configuration elements that configure the control device 40, the configuration element that controls the electromagnetic wave generation device 20 may be regarded as a part of the electromagnetic wave generation device 20, and the configuration element that controls the electromagnetic wave detection device 30 may be regarded as a part of the electromagnetic wave detection device 30. The modification example described above can also be applied to the second to fourth embodiments.

In addition, in the description in the first embodiment, all the groups configured with a plurality of electromagnetic wave generation elements 22B are the combinations of the electromagnetic wave generation elements 22B having the oscillation frequencies different from each other.

However, in a form (not illustrated) in which at least two electromagnetic wave generation elements 22B that oscillate at different oscillation frequencies is included in at least one of all the groups, it can be said that the electromagnetic waves W are not likely to interfere with each other compared to that in the comparative form in the description for the second effect.

Therefore, the form (not illustrated) in which at least two electromagnetic wave generation elements 22B that oscillate at the different oscillation frequencies is included in at least one of all the groups, is a form included in the technical scope of the present invention.

Further, in the description in the third embodiment, all of a plurality of electromagnetic wave generation elements 22B configuring each group of the electromagnetic wave generation units 22 have the same oscillation frequency. In addition, in the third embodiment, the control device 40 causes all the electromagnetic wave generation elements 22B of each group to oscillate in different phases.

However, in a form (not illustrated) in which at least two electromagnetic wave generation elements 22B that oscillate at the same oscillation frequency are included in at least one group among each group of the electromagnetic wave generation unit 22, and those at least two electromagnetic wave generation elements 22B are oscillated in different phases, the electromagnetic waves W emitted from each electromagnetic wave generation element 22B are unlikely to interfere with other (or do not interfere with other) compared to the comparative form in the third embodiment.

The form (not illustrated) in which at least two electromagnetic wave generation elements 22B that oscillate at the same oscillation frequency are included in at least one group among each group of the electromagnetic wave generation unit 22, and those at least two electromagnetic wave generation elements 22B are oscillated in different phases, is a form included in the technical scope of the present invention.

In addition, in the description in the fourth embodiment, all the plurality of electromagnetic wave generation elements 22B configuring each group of the electromagnetic wave generation unit 22 of the electromagnetic wave generation device 20C have the same oscillation frequency, and the voltage generation unit 24 applies the different bias voltages to each of the plurality of electromagnetic wave generation elements 22B.

However, in a form (not illustrated) in which at least one group includes at least two electromagnetic wave generation elements that oscillate at the same oscillation frequency when the same bias voltage is applied, and the voltage applying unit applies the different bias voltages to at least two electromagnetic wave generation elements such that at least two electromagnetic wave generation elements oscillate at the different oscillation frequencies, the electromagnetic waves W emitted from each electromagnetic wave generation element 22B are unlikely to interfere with other (or do not interfere with other) compared to the comparative form in the fourth embodiment.

Therefore, the form (not illustrated) in which at least one group includes at least two electromagnetic wave generation elements that oscillate at the same oscillation frequency when the same bias voltage is applied, and the voltage applying unit applies the different bias voltages to at least two electromagnetic wave generation elements such that at least two electromagnetic wave generation elements oscillate at the different oscillation frequencies, is a form included in the technical scope of the present invention.

In addition, in the description in the first embodiment, the oscillation start timing of the group that performs the mth oscillation (m is a natural number equal to or larger than 2 and equal to or smaller than n) is the same as the oscillation end timing of the group that performs the (m−1)th oscillation when the number of the plurality of groups is n (refer to FIG. 6). In the first embodiment, a fact that the relationship between the oscillation start timing and the oscillation end timing of each group is as illustrated in FIG. 6 is an example of causing a plurality of electromagnetic wave generation elements 22B to oscillate while shifting the timing in units of group.

Figure 10:
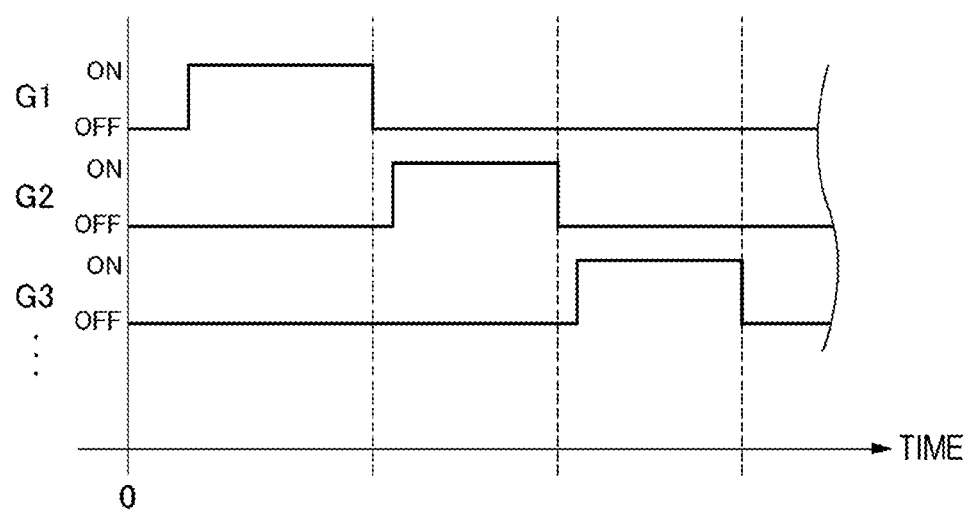
FIG. 10 is a timing chart of the oscillation operation by each group during the operation by the electromagnetic wave generation system in a first modification example.

However, an example of causing the plurality of electromagnetic wave generation elements 22B to oscillate while shifting the timing in units of group may be a form in the first modification example illustrated in FIG. 10. That is, the oscillation start timing of the group that performs the mth oscillation (m is a natural number equal to or larger than 2 and equal to or smaller than n) may be after the oscillation end timing of the group that performs the (m−1)th oscillation when the number of the plurality of groups is n. Even in the case of the first modification example, the effect same as that in the case of the first embodiment can be achieved.

Figure 11:
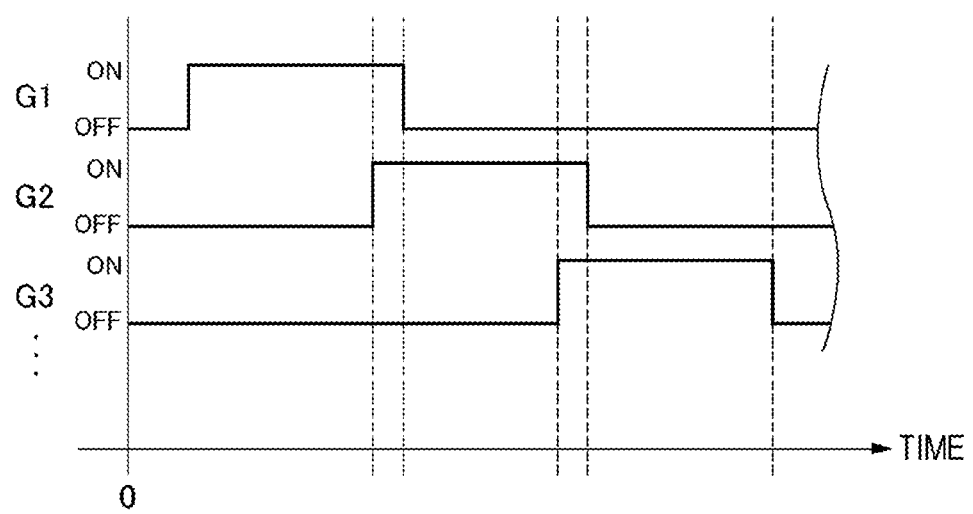
FIG. 11 is a timing chart of the oscillation operation by each group during the operation by the electromagnetic wave generation system in a second modification example.

In addition, an example of causing the plurality of electromagnetic wave generation elements 22B to oscillate while shifting the timing in units of group may be, for example, a form in the second modification example illustrated in FIG. 11. That is, the oscillation start timing of the group that performs the mth oscillation (m is a natural number equal to or larger than 2 and equal to or smaller than n) may be before the oscillation end timing of the group that performs the (m−1)th oscillation when the number of the plurality of groups is n. Even in the case of the first modification example, the effect same as that in the case of the first embodiment can be achieved. In addition, in the case of the second modification example, it can be said that it is effective in that the oscillation operation (measuring operation) can be completed in a shorter period of time compared to the first to fourth embodiments and the first modification example.

Figure 12:
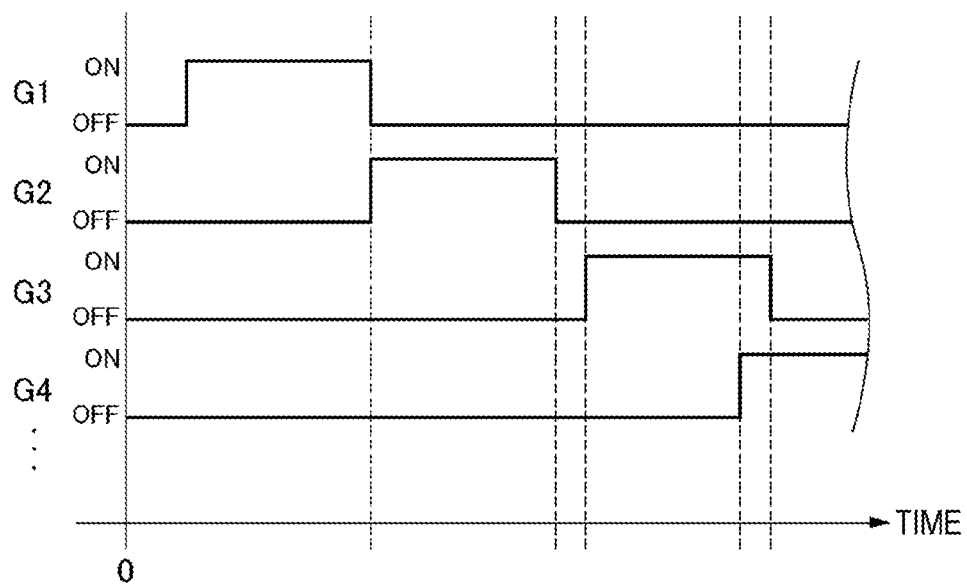
FIG. 12 is a timing chart of the oscillation operation by each group during the operation by the electromagnetic wave generation system in a third modification example.

In addition, an example of causing the plurality of electromagnetic wave generation elements 22B to oscillate while shifting the timing in units of group may be, for example, a form in the third modification example illustrated in in FIG. 12. That is, it may be a form in which the oscillation timings in the first embodiment, in the first modification example, and in the second modification example are combined.

In the description in the first embodiment, each group of the electromagnetic wave generation units 22 is configured by the combination of a plurality of electromagnetic wave generation elements 22B continuously arranged among a plurality of electromagnetic wave generation elements 22B (refer to FIG. 3).

However, as long as the plurality of electromagnetic wave generation elements 22B are divided into at least two or more groups, the combinations of the plurality of electromagnetic wave generation elements 22B configuring each group do not need to be continuously arranged. For example, as in the third modification example illustrated in FIG. 13, a plurality of electromagnetic wave generation elements 22B configuring one group may be arranged discontinuously.

This application claims priority on the basis of Japanese application Japanese Patent Application No. 2018-203595 filed on Oct. 30, 2018, and incorporates all of its disclosures herein.

REFERENCE SIGNS LIST

10: electromagnetic wave generation system
10A: electromagnetic wave generation system
10B: electromagnetic wave generation system
10C: electromagnetic wave generation system
20: electromagnetic wave generation device
20A: electromagnetic wave generation device
20B: electromagnetic wave generation device
20C: electromagnetic wave generation device
22: electromagnetic wave generation unit
22A: substrate
22B: electromagnetic wave generation element
24: voltage generation unit
30: electromagnetic wave detection device
32: electromagnetic wave detection unit
34: substrate
36: electromagnetic wave detection element
40: control device (an example of control unit)
42: storage unit
CP: control program
MO: measurement target object

The invention claimed is:

1. An electromagnetic wave generation device comprising:
   a plurality of electromagnetic wave generation elements that are divided into a plurality of groups; and
   a control unit that causes the plurality of electromagnetic wave generation elements to oscillate while shifting a timing on a basis of group unit of the plurality of electromagnetic wave generation elements,
   wherein at least one group of the plurality of groups includes at least two electromagnetic wave generation elements of the plurality of electromagnetic wave generation elements that oscillate at oscillation frequencies different from each other.

2. The electromagnetic wave generation device according to claim 1, wherein the control unit causes the plurality of electromagnetic wave generation elements to oscillate such that when a number of the plurality of groups is n, an oscillation start timing of a group of the plurality of groups that performs mth oscillation (m is a natural number equal to or larger than 2 and equal to or smaller than n) is the same timing as or after an oscillation end timing of a group of the plurality of groups that performs (m−1)th oscillation.

3. The electromagnetic wave generation device according to claim 1, wherein the control unit causes the plurality of electromagnetic wave generation elements to oscillate such that when a number of the plurality of groups is n, an oscillation start timing of a group of the plurality of groups that performs mth oscillation (m is a natural number equal to or larger than 2 and equal to or smaller than n) is before an oscillation end timing of a group of the plurality of groups that performs (m−1)th oscillation.

4. The electromagnetic wave generation device according to claim 1, wherein an oscillation frequency of the plurality of electromagnetic wave generation elements is equal to or higher than 70 GHz and equal to or lower than 10 THz.

5. The electromagnetic wave generation device according to claim 1, wherein all the electromagnetic wave generation elements included in the at least one group are the electromagnetic wave generation elements that oscillate at oscillation frequencies different from each other.

6. The electromagnetic wave generation device according to claim 1, wherein a difference between a maximum value and a minimum value of the oscillation frequencies different from each other is equal to or larger than 1 GHz and equal to or smaller than 100 GHz.

7. The electromagnetic wave generation device according to claim 1, further comprising:
   a voltage applying unit that applies a bias voltage to the plurality of electromagnetic wave generation elements,
   wherein at least an other one group of the plurality of groups includes at least two other electromagnetic wave generation elements of the plurality of electromagnetic wave generation elements that oscillate at the same oscillation frequency when the same bias voltage is applied, and
   wherein the voltage applying unit applies different bias voltages to the at least two electromagnetic wave generation elements such that the at least two electromagnetic wave generation elements oscillate at oscillation frequencies different from each other.

8. The electromagnetic wave generation device according to claim 1, wherein the plurality of electromagnetic wave generation elements are arranged along a straight-line direction, and
   wherein each of the plurality of groups is configured by a combination of the plurality of electromagnetic wave generation elements continuously arranged among the plurality of electromagnetic wave generation elements.

9. The electromagnetic wave generation device according to claim 1, wherein the plurality of electromagnetic wave generation elements is a resonant tunneling diode.

10. An electromagnetic wave generation system comprising:
    the electromagnetic wave generation device according to claim 1; and
    an electromagnetic wave detection device that operates a plurality of electromagnetic wave detection elements divided into a plurality of groups while shifting a timing in units of group, and detects electromagnetic waves generated by the plurality of electromagnetic wave generation elements.

11. The electromagnetic wave generation device according to claim 1, wherein at least parts of oscillation periods of the plurality of groups are different from each other.

12. The electromagnetic wave generation device according to claim 11, wherein an oscillation period of the oscillation periods is a period from an oscillation start timing of a group of the plurality of groups to an end timing of the group of the plurality of groups.

\* \* \* \* \*